(12) United States Patent
Alcoe et al.

(10) Patent No.: US 6,744,132 B2
(45) Date of Patent: Jun. 1, 2004

(54) MODULE WITH ADHESIVELY ATTACHED HEAT SINK

(75) Inventors: David J. Alcoe, Vestal, NY (US); Thomas W. Dalrymple, Endicott, NY (US); Michael A. Gaynes, Vestal, NY (US); Randall J. Stutzman, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/058,999

(22) Filed: Jan. 29, 2002

(65) Prior Publication Data

US 2003/0141586 A1 Jul. 31, 2003

(51) Int. Cl.[7] ............................................. H01L 23/48
(52) U.S. Cl. ...................... 257/706; 257/712; 257/717; 257/710; 361/717; 361/720
(58) Field of Search .................. 361/717, 718, 361/719, 720; 257/633, 706, 710, 712, 717

(56) References Cited

U.S. PATENT DOCUMENTS

| 5,121,190 A | * | 6/1992 | Hsiao et al. ............... 357/80 |
| 5,724,230 A | | 3/1998 | Poetzinger |
| 5,919,329 A | | 7/1999 | Banks et al. |
| 5,970,319 A | | 10/1999 | Banks et al. |
| 6,015,722 A | | 1/2000 | Banks et al. |
| 6,018,196 A | | 1/2000 | Noddin |
| 6,111,313 A | * | 8/2000 | Kutlu ........................ 257/697 |
| 6,140,707 A | | 10/2000 | Plepys et al. |
| 6,188,578 B1 | | 2/2001 | Lin et al. |
| 6,472,762 B1 | * | 10/2002 | Kutlu ........................ 257/778 |
| 6,597,575 B1 | * | 7/2003 | Matayabas et al. ......... 361/705 |

FOREIGN PATENT DOCUMENTS

JP        11284097        10/1999

* cited by examiner

*Primary Examiner*—Carl Whitehead, Jr.
*Assistant Examiner*—L. Cruz
(74) *Attorney, Agent, or Firm*—Schmeiser, Olsen & Watts; William H. Steinberg

(57) ABSTRACT

A method and structure to adhesively couple a cover plate to a semiconductor device. A semiconductor device is electrically coupled to a substrate. A stiffener ring surrounding the semiconductor device is adhesively coupled to the substrate. A cover plate is adhesively coupled to both a top surface of the semiconductor device and a top surface of the stiffener ring using a first and second adhesive, respectively. The modulus of the first adhesive is less than the modulus of the second adhesive.

9 Claims, 2 Drawing Sheets

MODULE WITH ADHESIVELY ATTACHED HEAT SINK

BACKGROUND OF THE INVENTION

1. Technical Field

The present invention relates to an electronic structure and associated method to adhesively couple a cover plate to a semiconductor device.

2. Related Art

A chip coupled to a substrate within an electronic structure may experience thermal strain from thermal cycling operations, in light of coefficients of thermal expansions (CTE) differential within the electronic structure. Such thermal strains may result in mechanical failure of the substrate. Thus, there is a need to inhibit such thermal strains.

SUMMARY OF THE INVENTION

The present invention provides an electronic structure, comprising:

a substrate;

a semiconductor device electrically coupled to the substrate;

a stiffener ring adhesively coupled to the substrate, wherein the stiffener ring surrounds the semiconductor; and a cover plate on a top surface of the semiconductor and on a top surface of the stiffener ring, wherein the cover plate is adhesively coupled to the top surface of the semiconductor by a first adhesive, wherein the cover plate is adhesively coupled to a top surface of the stiffener ring by a second adhesive, and wherein a modulus of the first adhesive is less than a modulus of a second adhesive.

The present invention provides an electronic structure, comprising:

a substrate;

a semiconductor electrically coupled to the substrate; and a cover plate on a top surface of the semiconductor, wherein the cover plate is adhesively coupled to the top surface of the semiconductor by a first adhesive, and wherein the first adhesive has a modulus less than about 500 psi.

The present invention provides a method for forming an electronic structure, comprising:

providing a semiconductor device;

electrically coupling the semiconductor device to a substrate;

adhesively coupling a stiffener ring to the substrate, wherein the stiffener ring surrounds the semiconductor device, and adhesively coupling a cover plate to a top surface of the semiconductor device with a first adhesive and to a top surface of the stiffener ring with a second adhesive, wherein a modulus the first adhesive is less than a modulus of a second adhesive.

The present invention advantageously inhibits thermal strains in a substrate within an electronic structure, wherein such thermal strains result from thermal cycling operations on the electronic structure.

DETAILED DESCRIPTION OF THE INVENTION

Figure 1:
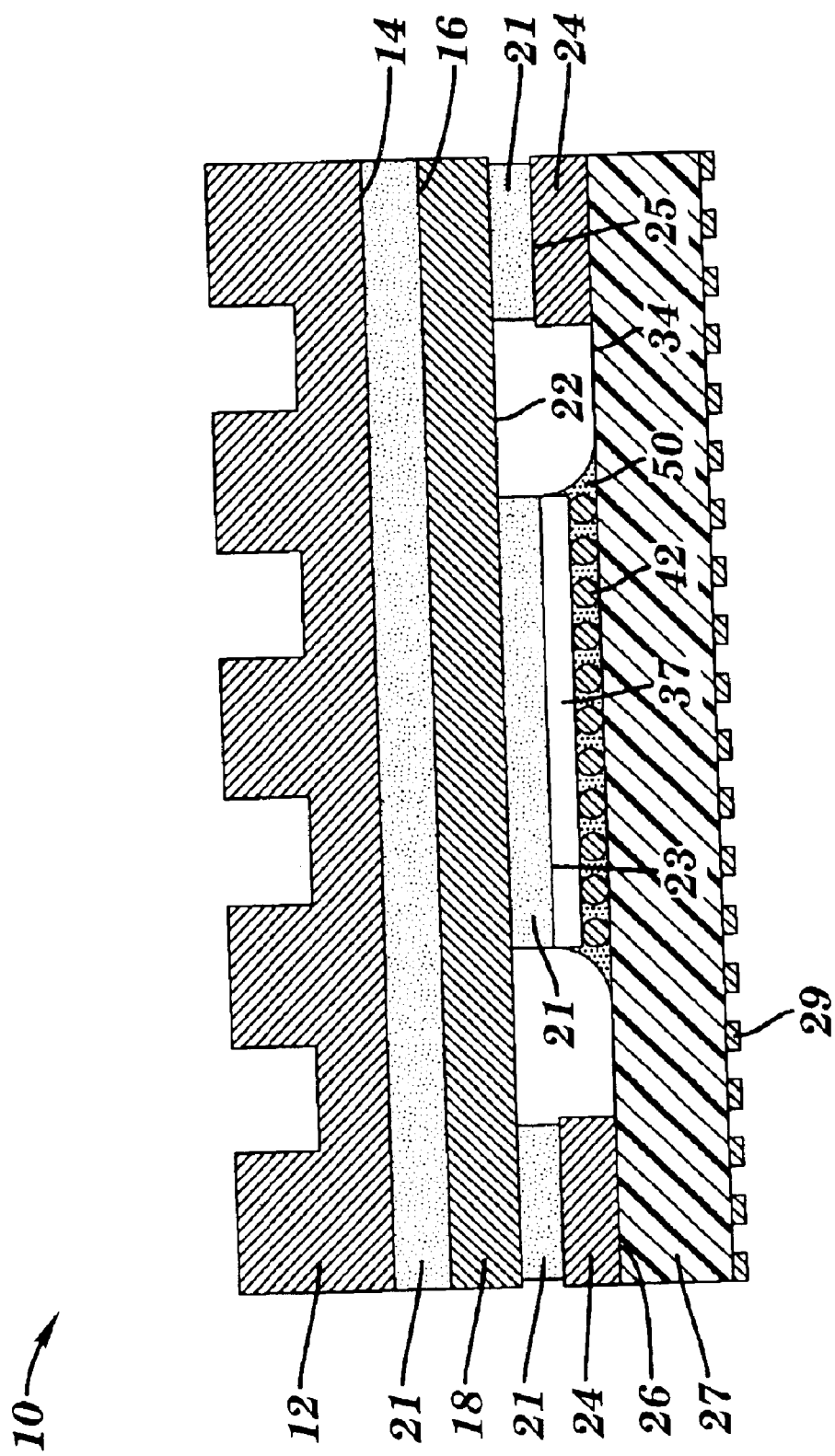
FIG. 1 depicts a cross-sectional view of an electronic structure having a cover plate coupled to a semiconductor device by an adhesive, in accordance with embodiments of the present invention.

FIG. 1 illustrates a front cross-sectional view of an electronic structure 10 using the same adhesive 21 in three different locations. In accordance with embodiments of the present invention. The adhesive may include, inter alia, silicon or epoxy. The electronic structure 10 comprises a semiconductor device 37, a substrate 27, a stiffener ring 24, a thermally conductive cover plate 18, a heat sink 12, and the thermally conductive adhesive 21. The semiconductor device may include, inter alia, a semiconductor chip. The cover plate 18 may include, inter alia, nickel plated copper, and the heat sink 12 may include, inter alia, aluminum. The cover plate may have a thickness of at least about 20 mils. The substrate 27 has a compliance range of 10 psi to $3 \times 10^6$ psi. Tho semiconductor device 37 is electrically coupled to a substrate 27 using a Controlled Collapse Chip Connection (C4) solder ball 42. The space surrounding the solder balls 42 may include an underfill 50. The substrate 27 may comprise, inter alia, a chip carrier or a printed circuit board. Input/Output (I/O) connections 29 may be attached to the substrate 27 such as when the substrate 27 is a chip carrier. The substrate 27 may include organic material such as, inter alia, TEFLON. A bottom surface 26 of the stiffener ring 24 is adhesively bonded to a top surface 34 of the substrate 27 such as by a tacky film adhesive. A bottom surface 22 of the cover plate 18 is adhesively coupled to both a top surface 23 of the semiconductor device 37 and a top surface 25 of the stiffener ring 24 by the adhesive 21. A bottom surface 14 of the heat sink 12 is adhesively coupled to a top surface 16 of the cover plate 18 by the adhesive 21. The adhesive 21 has a modulus of at least about 1000 psi (e.g. 1000–1200 psi). The coefficient of thermal expansion (CTE) of the heat sink 12 (e.g., 10 ppm/° C. to 24 ppm/° C.) is greater than the CTE of the cover plate 18 (e.g., 10 ppm/° C. to 24 ppm/° C.). The CTE of the cover plate 18 is greater than the CTE of the semiconductor device 37 (e.g., 2 ppm/° C. to 5 ppm/° C.). The CTE of the semiconductor device 37 is less than the CTE of the substrate 27 (e.g., 8 ppm/° C. to 50 ppm/° C.). The difference between the aforementioned CTE's create stress on the substrate 27 during thermal cycling. If the adhesive 21 having a modulus of at least 1000 psi is used in the previously mentioned three locations, thermal cycling will cause the heat sink 12 to expand and express itself through the following: the adhesive 21 below the heat sink 12, the cover plate 18, and the next layer of adhesive 21 below the cover plate 18, ultimately stressing and constraining the semiconductor device 37. The thermal cycling will cause the substrate 27 to be stressed under the constrained semiconductor device 37. Since the semiconductor device 37 is constrained by the structure above as described supra, internal strain within the substrate 27 can cause fatigue with sufficient thermal cycling. This internal strain within the substrate 27 is primarily located at corners of the semiconductor device 37 footprint, the underfill 50, the C4 solder balls 42, and the substrate 27. As stated supra, the preceding problem is observed during thermal cycling. A solution to the previously mentioned problem is illustrated in FIG. 2.

Figure 2:
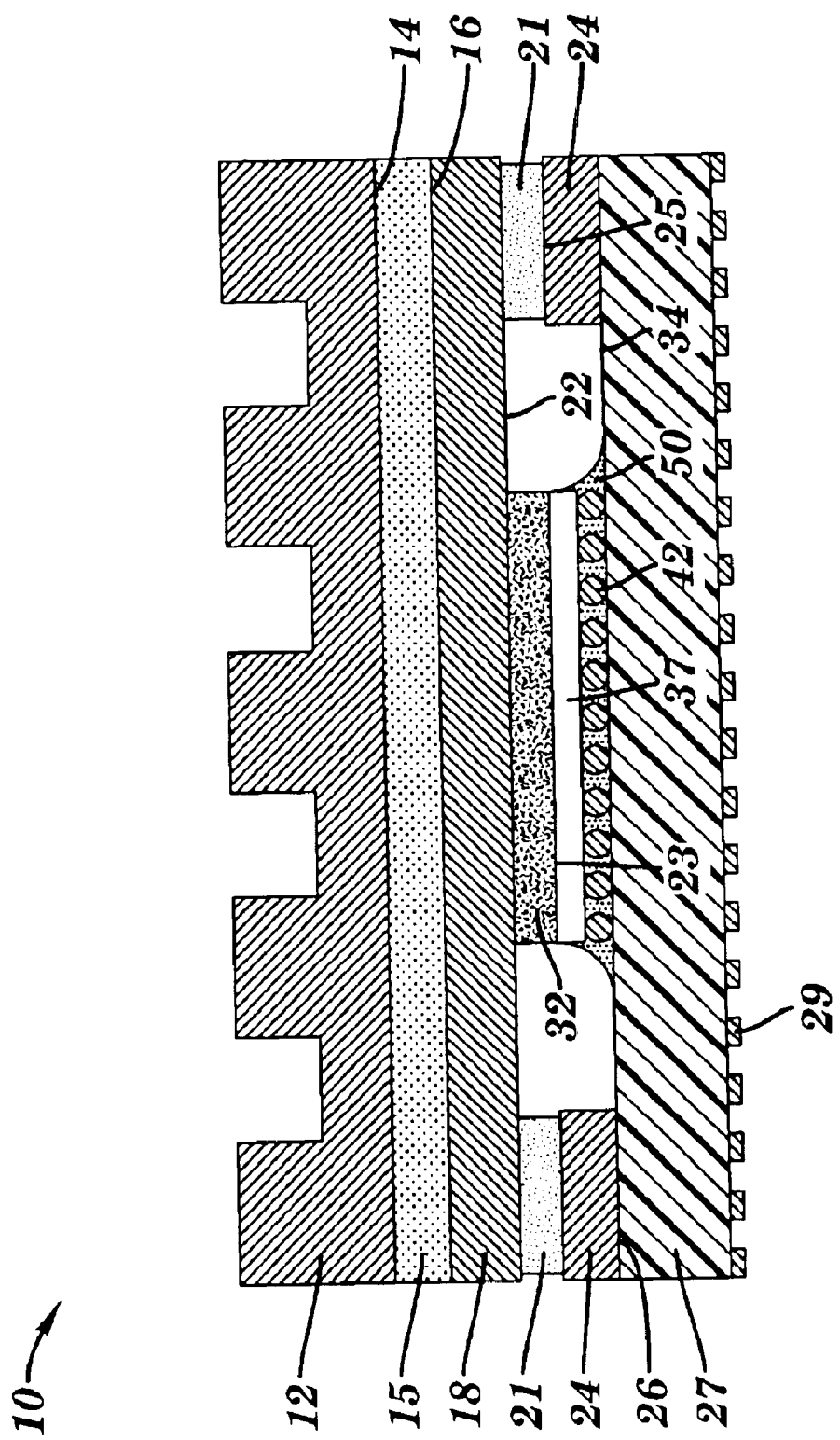
FIG. 2 depicts a cross-sectional view an electronic structure having a cover plate coupled to a semiconductor device by an ultra low modulus adhesive, in accordance with embodiments of the present invention.

FIG. 2 illustrates a modification of FIG. 1 using a combination three adhesives, in accordance with embodiments of the present invention. In FIG. 2, the electronic structure 10 uses an ultra low modulus adhesive 32 having a modulus of less than about 500 psi and a thermal conductivity of at least about one watt per meter degree K to adhesively couple the top surface 23 of the semiconductor device 37 to the bottom surface 22 of the cover plate 18. The ultra low modulus of the ultra low modulus adhesive 32 inhibits constraining of the semiconductor device and corresponding formation of strain on the substrate 27 during thermal cycling. A thermoset adhesive can be used, inter alia, for the ultra low modulus adhesive 32. For structural integrity, the adhesive 21, used to adhesively couple the top surface 25 of the stiffener ring 24 to the bottom surface 22 of the cover plate 18 has a higher modulus than the ultra low modulus adhesive 32 used to adhesively couple the top surface 23 of the semiconductor device 37 to the bottom surface 22 of the cover plate 18. An adhesive 15 is used to adhesively couple the bottom surface 14 of the heat sink 12 to the top surface 16 of the cover plate 18. An advantage of using the ultra low modulus adhesive 32 to adhesively couple the top surface 23 of the semiconductor device 37 to the bottom surface 22 of the cover plate 18 is that the range of modulus for the adhesive 15 increases from 1000–1200 psi up to a value of about 1,000,000 psi. The adhesive 15 normally has a modulus that is less than the modulus of the adhesive 21. However, the modulus of the adhesive 15 may or may not be equal to the modulus of the adhesive 32, and still the advantage of the ultra-low modulus adhesive can be obtained.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electronic structure, comprising:

a substrate;

a semiconductor device electrically coupled to the substrate;

a stiffener ring adhesively coupled to the substrate, wherein the stiffener ring surrounds the semiconductor; and a cover plate on a top surface of the semiconductor and on a top surface of the stiffener ring, wherein the cover plate is adhesively coupled to a portion of the top surface of the semiconductor by a first adhesive, wherein the cover plate is adhesively coupled to a portion of the top surface of the stiffener ring by a second adhesive, wherein an elastic modulus of the first adhesive is less than an elastic modulus of a second adhesive and, wherein the first adhesive has an elastic modulus less than 500 psi.

2. The electronic structure of claim 1, further comprising a heat sink, wherein the heat sink is coupled by a third adhesive to a portion of a top surface of the cover plate.

3. The electronic structure of claim 2, wherein an elastic modulus of the third adhesive is less than the elastic modulus of the second adhesive.

4. The electronic structure of claim 3, wherein the elastic modulus of the third adhesive is about equal to the elastic modulus of the first adhesive.

5. The electronic structure of claim 3, wherein the elastic modulus of the third adhesive is not equal to the elastic modulus of the first adhesive.

6. The electronic structure of claim 1, wherein the substrate has a compliance range of $10^4$ psi to $3 \times 10^6$ psi.

7. The electronic structure of claim 1, wherein the semiconductor device includes a semiconductor chip.

8. The electronic structure of claim 1, wherein the substrate is selected from the group consisting of a chip carrier and a printed circuit board.

9. The electronic structure of claim 1, wherein the substrate comprises an organic material.

* * * * *